United States Patent
Thirugnanasambandham et al.

(10) Patent No.: US 8,350,487 B2
(45) Date of Patent: Jan. 8, 2013

(54) SWITCH CIRCUIT

(75) Inventors: Kanthimathinathan Thirugnanasambandham, Bangalore (IN); Girish Ramdas Wabale, Bangalore (IN); Vignesh Eswara Prasad, Bangalore (IN); Michael Andrew Simpson, Billericay (GB)

(73) Assignee: Novar ED&S Limited, Berkshire (GB)

( * ) Notice: Subject to any disclaimer, the term of this patent is extended or adjusted under 35 U.S.C. 154(b) by 284 days.

(21) Appl. No.: 12/791,712

(22) Filed: Jun. 1, 2010

(65) Prior Publication Data

US 2011/0291735 A1    Dec. 1, 2011

(51) Int. Cl.
H05B 39/04 (2006.01)
H03K 17/00 (2006.01)

(52) U.S. Cl. .................................. 315/209 R; 315/307

(58) Field of Classification Search .............. 315/209 R, 315/186, 193, 217, 225, 307; 327/365
See application file for complete search history.

(56) References Cited

U.S. PATENT DOCUMENTS

| | | | |
|---|---|---|---|
| 4,998,045 A | 3/1991 | Ruby | |
| 5,428,265 A | 6/1995 | Booth, Jr. et al. | |
| 6,815,625 B1 | 11/2004 | Leopold et al. | |
| 7,098,610 B2 | 8/2006 | Rodriguez | |
| 7,190,124 B2 | 3/2007 | Kumar et al. | |
| 7,259,527 B2 | 8/2007 | Foo | |
| 7,332,683 B2 | 2/2008 | Gorman | |
| 7,339,331 B2 | 3/2008 | Vanderzon | |
| 7,570,031 B2 | 8/2009 | Salvestrini | |
| 7,586,718 B1 | 9/2009 | Radosavljevic et al. | |
| 7,837,344 B2 * | 11/2010 | Altonen et al. | 362/85 |
| 2007/0216318 A1 * | 9/2007 | Altonen et al. | 315/209 R |
| 2009/0108765 A1 | 4/2009 | Weightman et al. | |
| 2009/0200952 A1 | 8/2009 | King | |
| 2009/0219005 A1 | 9/2009 | Salvestrini | |
| 2009/0315477 A1 | 12/2009 | Kinsella | |
| 2010/0060181 A1 | 3/2010 | Choi et al. | |
| 2010/0141158 A1 | 6/2010 | Newman, Jr. et al. | |
| 2010/0164406 A1 | 7/2010 | Kost et al. | |

FOREIGN PATENT DOCUMENTS

| | | |
|---|---|---|
| DE | 10012082 | 10/2001 |
| EP | 1135007 | 9/2001 |
| EP | 1158841 | 11/2001 |

(Continued)

OTHER PUBLICATIONS

U.S. Appl. No. filed Feb. 9, 2010.

*Primary Examiner* — Daniel D Chang
(74) *Attorney, Agent, or Firm* — Seager Tufte & Wickhem LLC.

(57) ABSTRACT

A switch circuit, particularly suitable for dimmer switches, detects zero-crossing or similar points in the supply and uses those to make predictions of future zero-crossing occurrences. The predicted occurrences may be used to time the operation of the switch itself to chop the supply which results in less variation in the power supplied (flicker if the switch circuit is operating a lamp) since the positions of the measured zero-crossings can be subject to noise but flicker is reduced if the switch is operated at times with respect to the true supply waveform. The predicted times may be obtained from a local oscillator having a period set by, for example, low pass filtering the period of the measured zero-crossings. The phase of the oscillator may be adjusted such that an error between the predicted and measured zero-crossings is reduced.

12 Claims, 5 Drawing Sheets

FOREIGN PATENT DOCUMENTS

| | | |
|---|---|---|
| GB | 2343796 | 5/2000 |
| GB | 2418082 | 3/2006 |
| JP | 2006032030 | 2/2006 |
| JP | 2008035632 | 2/2008 |
| WO | 03005550 | 1/2003 |
| WO | 2007006851 | 1/2007 |
| WO | 2009036517 | 3/2009 |
| WO | 2009099522 | 8/2009 |

* cited by examiner

SWITCH CIRCUIT

The present invention relates to the field of controlling a current to a load. More particularly, but not exclusively, this invention relates to the field of dimmer switches for controlling the power supplied to a lighting load.

BACKGROUND

Conventionally dimmers work by chopping up each period of a sine wave of an AC supply into a portion in which the load is connected to the supply (on) and a portion in which it is disconnected (off). One approach is to turn the supply to the load off whenever the sinusoid of the supply passes through zero, and then turn it back on again at a voltage determined by the setting of a control knob or the like. Another approach is to turn the supply to the load on whenever the supply passes through zero and then turn it off at a voltage determined by the setting of a control knob or the like. The proportion of the time during the AC cycle (the "duty cycle") and hence the power delivered to the load is therefore controlled by the control knob. In some prior art dimmers, a triac is used as a switch to turn the supply to the load on and off, with the gate thereof being connected to a voltage controlled by the control knob. Others use a MOSFET which have a small voltage drop between source and drain and so provide low power loss.

A problem with dimmers is related to low voltage lighting that uses an "electronic transformer". Low voltage lamps are, of course, not directly connected to the mains supply, but rather are typically powered by a transformer, usually an "electronic transformer". As is known, electronic transformers typically derive a low voltage AC supply via an oscillator that is powered by the mains supply, often with the oscillation of around 40 kHz controlled by a diac (Diode for Alternating Current) or the like. The problem with these transformers is that they often generate jitter, which is fed back to the AC supply. In particular, if the supply to the electronic transformer is via a dimmer, the zero-crossing of the supply across the dimmer often jitters around the true zero crossing of the voltage of the mains supply, because the switching of the electronic transformer is not synchronous to the mains supply. This can be a problem, if as in the present invention, the dimmer bases its switching timing on measurements of the timing of the zero crossing, which are affected by this jitter. In turn, this affects the power delivered, causing the lamps to flicker, which is often unacceptable to users. The flicker is often caused by the window for which the lamp is on being offset differently with respect to the sine wave of the main supply in each cycle thereof.

SUMMARY

In one illustrative embodiment, a switch circuit particularly suitable for dimmer switches is provided. The switch circuit may detect zero-crossing or similar points in a supply, and may use those to make predictions of future occurrences of either of those points or of other similar points, as desired. The predicted occurrences may be used to time the operation of the switch itself to chop the supply, which may result in less variation in the power supplied to a load, particularly when the load includes an electronic transformer. This may reduce flicker when the electronic transformer is driving a lamp or the like. Since the positions of the measured zero-crossings can be subject to noise, flicker may be reduced if the switch is operated at times with respect to the true supply waveform. The predicted zero-crossing times may be obtained from a local oscillator having a period set by, for example, low pass filtering the period of the measured zero-crossings. The phase of the oscillator may be adjusted such that an error between the predicted and measured zero-crossings is reduced.

According to an illustrative embodiment, there is provided a switch circuit comprising
  first and second terminals,
  a switch connected between the first and second terminals, and
  a control circuit connected to the switch to operate it to selectively connect and disconnect the first and second terminals,
  the control circuit may include:
  a defined point detector connected to the first and second terminals to provide indications of times of occurrences of a defined point on the waveform between the first and second terminals;
  a period low-pass filter connected to receive the indications of the defined point times and to provide a low-pass filtered signal of the periods between the times indicated;
  a local oscillator connected to receive the low-pass filtered periods and to provide indications of predicted defined point times based on the previous predicted defined point time and the current value of the low pass-filtered period;
  a phase comparator connected to receive the indications of the defined point times and the respective indications of predicted defined point times and to provide error indications of a difference between respective pairs of those;
  an error low-pass filter connected to receive the error indications and to provide a low-pass filtered output of those;
  a phase adjuster connected to receive the low-pass filtered error indications and to apply those to the low-pass filtered periods before those periods are applied to the local oscillator; and
  an output section connected to receive the predicted defined point times and responsive thereto to operate the switch to selectively connect and disconnect the first and second terminals.

In some cases, the switch circuit may comprise a scaler connected to receive the low-pass filtered error indications and to scale those down by some factor.

The error low pass filter itself may be provided in the form of a scaler if desired.

The error low pass filter may have a shorter response time than the period low pass filter.

In some cases, the defined point detector may be connected to detect the potential difference between the first and second terminals passing through a reference level. The reference level may be zero or may be non-zero.

The output section may comprise a window generator responsive to the predicted defined point times to generate switch on and switch off times. The output section may be further responsive to a power level indication in the generation of the switch on and switch off times.

According to the present invention, there is also provided a method of controlling a switch. An illustrative method may include:
  measuring to obtain indications of the times of occurrences of a defined point in the waveform of a supply connected across the switch,
  low-pass filtering the durations of the periods between the indicated defined point times, applying the low-pass filtered periods to a local oscillator to control the period thereof, the local oscillator providing predictions of the times of the next occurrence of the defined point, detecting the error between the times of respective measured and predicted occurrences of the defined point, low-pass filtering the errors and adjusting the low-pass filtered periods applied to the local oscillator with the resultant in the sense that tends to reduce the error, and operating the switch at times dependent on the predicted times of the occurrences of the defined point.

The defined point may be a zero-crossing in the waveform.

The present invention may further relate to a dimmer switch. An illustrative dimmer switch may include:

first and second mains terminals, a switch connected between the first and second terminals, and a control circuit connected to the switch to operate it to selectively connect and disconnect the first and second terminals, the control circuit may include:

a defined point detector connected to the first and second terminals to provide indications of times of occurrences of a defined point on the waveform between the first and second terminals;

a period low-pass filter connected to receive the indications of the defined point times and to provide a low-pass filtered signal of the periods between the times indicated;

a local oscillator connected to receive the low-pass filtered periods and to provide indications of predicted defined point times based on the previous predicted defined point time and the current value of the low pass-filtered period;

a phase comparator connected to receive the indications of the defined point times and the respective indications of predicted defined point times and to provide error indications of the difference between respective pairs of those;

an error low-pass filter connected to receive the error indications and to provide a low-pass filtered output of those;

a phase adjuster connected to receive the low-pass filtered error indications and to apply those to the low-pass filtered periods before those periods are applied to the local oscillator; and an output section connected to receive the predicted defined point times and responsive thereto to operate the switch to selectively connect and disconnect the first and second terminals.

DESCRIPTION

Figure 1:
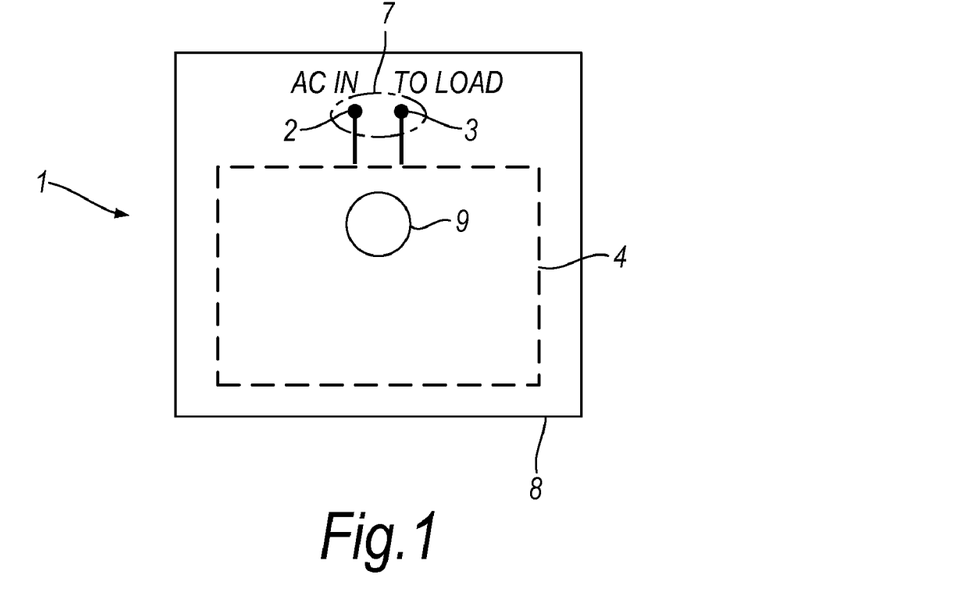
FIG. 1 is a front view of an illustrative dimmer in accordance with the invention.

FIG. 1 is a block diagram of an illustrative dimmer 1 in accordance with the invention.

The exemplary dimmer 1 includes a circuit 4 that connects, or at other times interrupts, an AC (Alternating Current) in terminal 2 to a load terminal 3. The circuit 4 is shown mounted inside an enclosure 8, which for example, may be wall mounted. The illustrative dimmer has an opening 7 on the reverse to allow connection to a mains cable comprising the conductors to be connected to the AC in terminal 2, for connection to the live or hot conductor, and load 3 terminal, for connection to the conductor leading to the load. Normally such a dimmer, as with an ordinary light switch, is not supplied with the neutral conductor, which is fed directly to the load, for example a lamp. A manually operated control knob 9 is provided to allow the user to indicate a desired level of current to be supplied to the load by the dimmer (In other examples this input could be provided by some remote manual control or by an electronic controller module, local or remote, as desired.)

Figure 2:
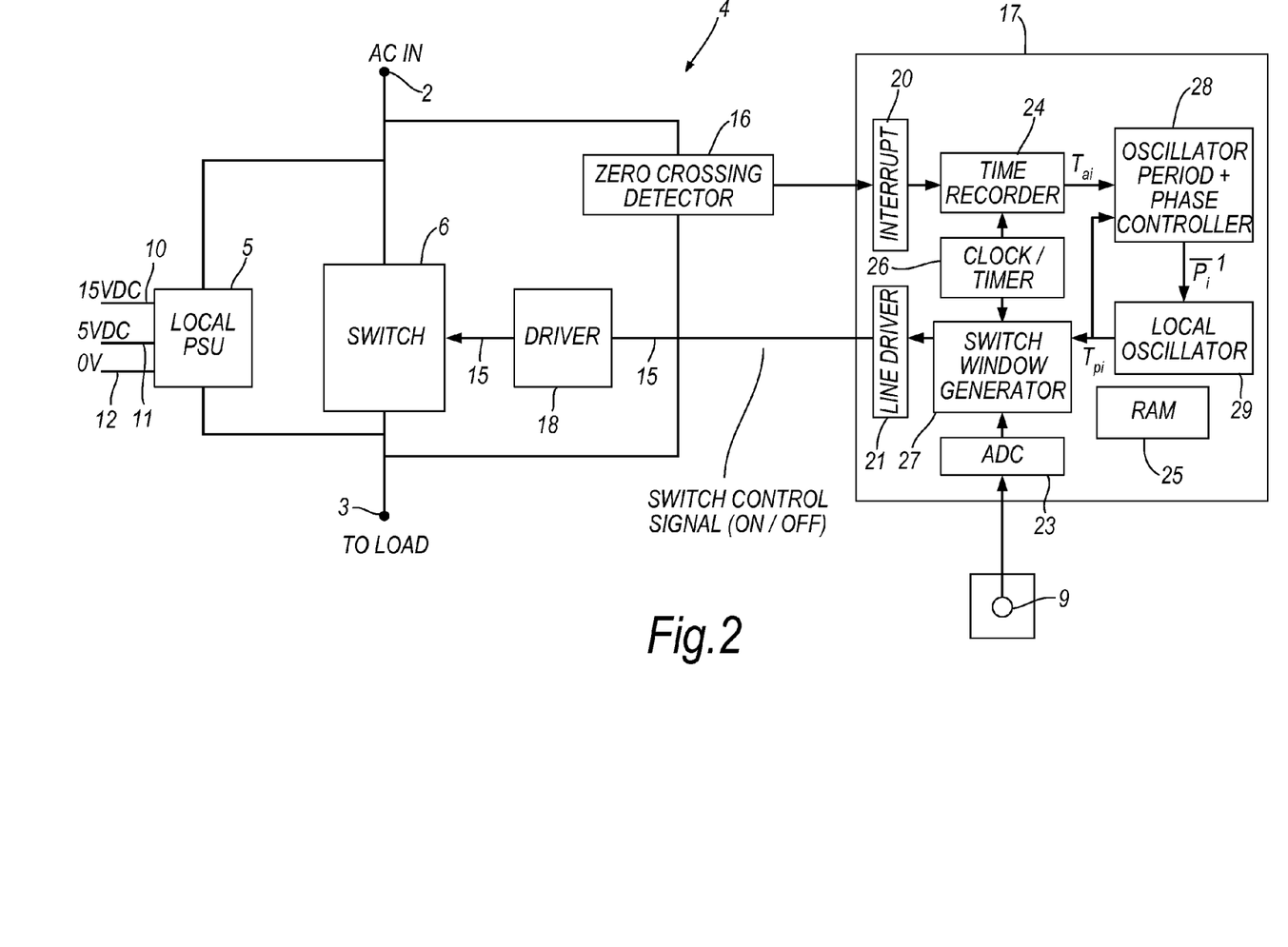
FIG. 2 is a block diagram of the circuit of the illustrative dimmer of FIG. 1.

FIG. 2 is a block diagram of the circuit 4, which in some cases is provided on a printed wiring board. The main component is a switch 6, which either connects or disconnects the load terminal 3 from the AC in terminal 2.

In the illustrative embodiment, some of the components of the circuit 4 need low voltage DC to power them. This is provided by local power supply unit (PSU) 5, which is connected between the AC in and load terminals and, in some cases, derives power from those by the process of "power stealing", which is known in the art. At times when the switch 6 is open, the local PSU derives power from the potential difference between those two terminals, which it provides as DC supplies even when the switch 6 is closed, the necessary power having been stored in a capacitor or the like in the local PSU 5. Here 15V and 5V supplies 10 and 11 are provided with respect to a local ground 12.

A zero-crossing detector (ZCD) 16 is connected to sense the voltage waveform between the AC in 2 and load 3 terminals; it indicates the timing of that event to a controller 17.

More generally the detector 16 may be a defined point detector detecting any defined point on the waveform (not just a zero-crossing) present on terminals 2 and 3, and further this defined point may be on the voltage or current waveform (or conceivably a point on some combination thereof, such as power). The zero-crossing is often an easy defined point to detect and often gives relatively accurate results. For current the zero-crossing is the point at which the current reverses direction. Other possible defined points include, for example, a threshold level through which the waveform passes, or other points such as maxima or minima, which for example may be detected by differentiating the waveform and detecting zeroes in the differential. All of these or any other defined points on the waveform are suitable points for the method employed by the controller 17, which is described further below.

Returning to the present example, and in some cases, the zero-crossing detector may not directly measure the zero-crossing itself, which would be ideal, but may detect the voltage waveform passing through a threshold at a particular voltage level just below zero which occurs just before, or just after, each zero crossing depending on whether the zero-crossing is positive- or negative-going. Since the threshold level is near zero, it is a fairly reliable indication of the position of the zero-crossing and an actual time for the zero-crossing can be obtained by, for example, applying a time offset.

Note that the voltage between the terminals 2 and 3 is sensed by the ZCD 16 when the switch 6 is open. The controller 17 may arrange for the switch 6 to be in the open position when a zero-crossing is to be detected. Notably, when the switch 6 is open, the full mains voltage is present between terminals 2 and 3. Detection of a defined point when the switch is closed is possible, but since the voltage across the switch may be smaller in amplitude, a more sensitive voltage detector may be needed to achieve similar detection accuracy.

The form of the signal provided by the ZCD may be a square wave with the rising and falling edges indicating respective ones of the zero-crossings from below and above. In some cases, the square wave could be at half the frequency of the AC in 2, with all of its edges aligned to the positive going zero crossings—or alternatively all aligned to the negative going zero crossings. That would indicate only one type of zero-crossing to the circuit, but that is sufficient for timing the windows when the switch is on.

In some cases, the switch 6 may be a MOSFET switch. In some cases, the switch 6 may include two (2) MOSFETS in inverse series connected across terminals x and y, and their gates connected to receive a switch control signal 15 that causes the switch to be open (i.e. non-conducting) or closed (i.e. conducting) as decided by the remainder of the circuit 4. As will be apparent to the skilled person, many other forms of switches that are responsive to a control signal 15 could be used.

The controller 17 may operate to provide the switch control signal 15. The controller 17 may be, in one example, a microcontroller or microprocessor programmed as described below. In other examples, the controller 17 may be hardwired, for example, as a programmable logic array (PLA) having similar hardwired modules to the software modules of the microcontroller example, or could be formed of analog circuits having the same functions.

A driver circuit 18, connected intermediate the controller 17 and the switch 6, may condition the control signal to an appropriate level to drive the switch 6.

In some cases, the microcontroller 17 may be provided with interfacing circuits as follows.

An interrupt circuit 20 may be connected to receive signals from the ZCD 16, indicating the times of occurrence of the zero-crossings at the switch 6. This interrupt circuit 20 may cause the microcontroller 17 to perform an interrupt routine, namely a time recorder software module 24, which notes the respective times $T_{ai}$ of the actual measured zero-crossings as indicated by a hardware clock 26 of the microcontroller 17, and records it in an on-board RAM 25 of the microcontroller 17. Subscript "i" is an index indicating the particular occurrence of a zero-crossing. RAM 25 is used, in this example, to note all results and variables used in the operation of the microcontroller 17, but as is known, external RAM may be used alternatively or in addition.

A line driver 21 may generate the switch control signal 15 as a simple high or low logic level, indicating that the switch 6 should be open or closed. This signal is conditioned by the driver 18. The line driver 21 is operated by the switch signal window generator program module 27. The switch window generator 27, the line driver 21 and the driver 18 form an output section for the circuit 4 that is responsive to the result of the controller 17 processing a detected zero-crossing.

The switch window generator 27 calculates the beginning and end of windows during which switch 6 is to be held closed. Generally, it sets the beginning of each window $\Delta_s$ ms (where $\Delta_s$ is a constant) after a predicted time for each positive going zero-crossing (or alternatively after each negative going, or after both). Each window has a duration $\Delta_d$ determined by the position of manual knob 9. The longer the duration of the window, the more power is delivered to the load—if the load is a lamp the brighter it will be. As is also known in the art, the power delivered to the load can also be varied by positioning the window during portions of the waveform of the AC supply that have a greater or lesser average voltage. Preferably, in this example, $\Delta_s$ is zero and the switch 6 is turned on at the predicted zero-crossing.

The switch window generator 27 uses as its reference point respective times predicted $T_{pi}$ of the zero-crossing that are provided by the other modules of the microcontroller 17 in the manner to be described below (i again being an index denoting the particular occurrence of zero-crossing). Once it has calculated the beginning and end times of each window, the switch window generator 27 uses the clock 26 to operate the line driver 21 to change its output at those times. Since, in this example, the zero-crossing detector is arranged to detect a level below the actual zero crossing, it still of course provides an indication of the time of the zero-crossing. The difference in timing is allowed for with a compensating offset in time, applied either by the switch window generator 27 or as an adjustment to the times $T_{ai}$ before they are used in the prediction of the zero crossing times. The offset used may be a constant since the amplitude of the mains voltage sinusoid is known and so is calculated on that basis (and any variation in the actual mains voltage amplitude may not cause significant error.)

An analog to digital converter ADC 23 of the microcontroller 17 may be used to convert the position of the knob 9 into a digital number that indicates to the switch window generator 27 the desired power level. The knob 9 may be coupled to a potentiometer, whose resistance is supplied with a constant voltage bias and whose $3^{rd}$ tap contact is connected to the input of the ADC 23 to indicate the desired power level. Other methods may be used to indicate the desired power level, which may be provided at the dimmer 1 or sent to it from a remote location.

The microcontroller 17, as shown in FIG. 2, may have two further program modules, and these may provide the predictions of the true mains zero-crossings from the actual measured zero-crossings $T_{ai}$. These modules are shown in greater detail in FIG. 3.

Now, the measured time of each zero-crossing may vary significantly from cycle to cycle if the load is an electronic transformer. Another source of variation in the time of the zero-crossing is the variation of the frequency of the mains supply. Although the power supply company endeavours to keep this at 60 Hz (or 50 Hz for many countries) the actual frequency of the supply may vary slightly, usually over seconds or minutes.

Note that in this example of a two-wire dimmer switch, the neutral is not available, so only the noisy voltage between the AC in 2 and load 3 terminals is available for the detection of zero-crossings. So, if the timing of the windows were to be set relative to the raw timings of the zero-crossings detected by the zero-crossing detector 16, then the windows would be at different places relative to the actual zero-crossing in the voltage between the live and neutral conductors of the mains supply, so each window would deliver a different amount of power, which is undesirable—in the case of lamps, may cause flicker.

To help alleviate this problem, the program of controller 17 may be provided with a local oscillator 29 and an oscillator period and phase controller 28 module, which provide the predictions for the true positions of the zero-crossings $T_{pi}$ (or for the hardwired PLA etc., the hardwired equivalents).

Figure 3:
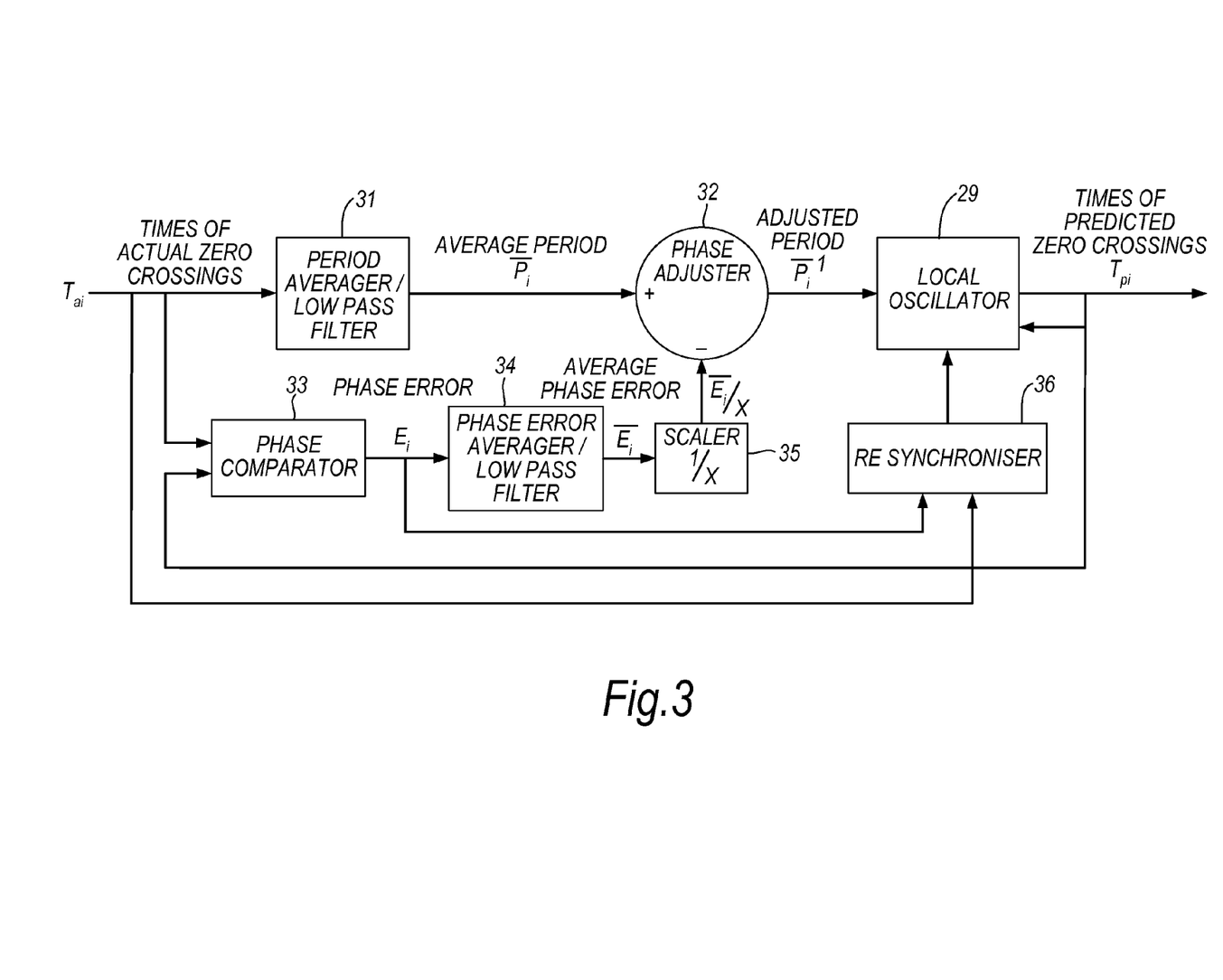
FIG. 3 is a more detailed block diagram of the local oscillator period and phase controller, together with the local oscillator, of the illustrative circuit of FIG. 2.
Figure 4:
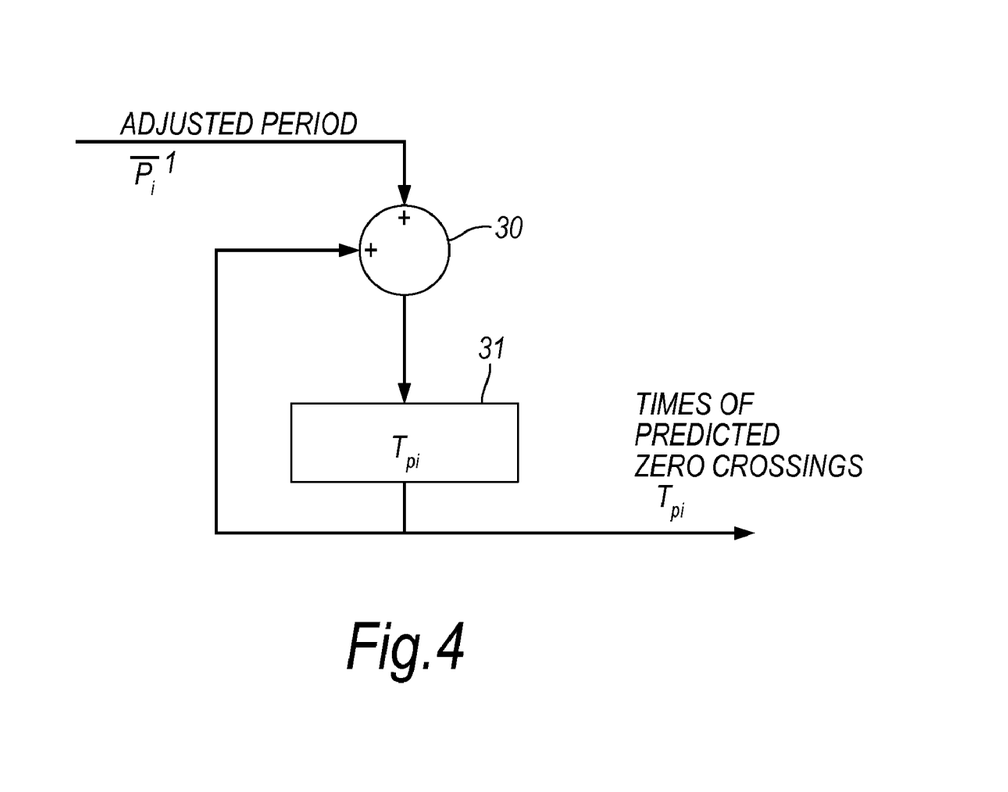
FIG. 4 is a block diagram of the illustrative local oscillator of FIGS. 2 and 3.

FIG. 3 shows these modules in more detail. The local oscillator itself (details shown in FIG. 4) simply adds, with adder 30, the output $\overline{P}i'$ of the oscillator period and phase controller 28 to the previous predicted zero-crossing time; i.e. $T_{p(i+1)} = T_{pi} + \overline{P}i'$. A register (not shown) holds the successive values of $T_{pi}$, which is provided and stored in RAM 25.

The oscillator period and phase controller 28 module may include several component software modules, as shown in FIG. 3, namely: a period low-pass filter 31, a phase adjuster 32, a phase comparator 33, a phase error low-pass filter 34 and a scaler 35. Again, and in some illustrative embodiments, the functions of these are performed by the microcontroller 17 under the instruction of program code, but could be performed by hardwired logic, for example, in a PLA or by analog circuits as desired.

In the illustrative embodiment, the period low-pass filter 31 is connected to receive the indications $T_{ai}$ of the detected positions of the zero-crossings. In this example, only the positive going (or alternatively only the negative going) crossings are used. For each it calculates the period since the last; i.e. $P_i = T_{ai} - T_{a(i-1)}$. From those it calculates an average of recent periods. The average is recalculated after each positive going zero-crossing is detected. The new average may be calculated as 63/64 of the previous average plus 1/64 of the current period $P_i$, i.e.

$$\overline{P}_i = \left(\overline{P}_{i-1} \times \frac{63}{64}\right) + \left(\frac{P_i}{64}\right).$$

Other methods could be used such as a moving average (for example of the last 64 periods), but, as can be seen from the equations, the illustrative method requires little storage. In fact, to keep the calculation even simpler, the calculations may not be calculated directly as the equations suggest, but the value $\Sigma_i = 64 \times \overline{P}_i$ may be stored between each iteration, which is then used to calculate $\Sigma_i = \Sigma_{i-1} - \overline{P}_{i-1} + P_i$ and $$\overline{P}_i = \frac{\Sigma_i}{64}.$$

This may avoid having to multiply $\overline{P}_{i-1}$ by 63, which is time consuming, dividing $P_i$ by 64, which would involve much more resolution that dividing $\Sigma_i$ by 64.

In the example shown, this average period $\overline{P}$ is applied to the local oscillator 29 (via the phase adjuster 32), and so the period of the local oscillator follows that of the mains supplied by power supply company. This by itself does not keep the predicted times of the mains zero-crossings produced by the local oscillator in phase with the mains as supplied by the power supply company. That may be performed by the rest of the modules of FIG. 3, which also act to reject jitter and noise such as that from a downstream electronic transformer for driving low voltage lamps.

The low-pass filtering of the period takes into account roughly the last 64 samples of the period (in such a filter the last 64 samples account for 63.5% of the output). So since these samples occur over approximately 1 s (they are, of course, taken at 60 Hz, which is the frequency of the main supply in the United States), variations in the period of the mains supply as supplied by the power company that occur over periods longer than that are taken into account.

A phase comparator module 33 also receives the actual measured zero-crossings $T_{ai}$ and, in addition to that, from the local oscillator, the predicted zero-crossings $T_{pi}$, and calculates the interval of time between them $E_i$, which may be positive or negative. While this is an amount of time, it can be termed a phase error because it is indicative of the phase angle between the actual and predicted zero-crossings since the phase angle is the calculated error divided by the period of the zero-crossings. In any event, if there is a difference in phase between the predicted times of the zero-crossing and the actual zero-crossings $T_{ai}$, then $E_i$ will be non-zero and $E_i$ is applied to the period used by the local oscillator 29, by phase adjuster 32, by adding it in a sense that reduces the error. That is, if the predicted zero-crossing occurs after the actual zero-crossing, then the period of the local oscillator is reduced, and if the predicted zero-crossing occurs before the actual zero-crossing, then the period of the local oscillator is increased.

In some instances, before it is utilised in the phase adjuster, the calculated difference $E_i$ between the times of the predicted and actual zero-crossing is processed by a phase error low-pass filter 34 and a scaler 35. These are designed together to respond to variations in the times of the actual zero-crossings $T_{ai}$ quicker than the low-pass filter 31, so that the oscillator is kept in phase even as the average period $\overline{P}_i$ changes. In this example of this low-pass filter, the output $\overline{E}_i$ may be calculated as $$\overline{E}_{i-1} \times \frac{15}{16} + \frac{E_i}{16}.$$

This low pass filter may respond to errors in the times of the predicted zero-crossings that persist over about 1/4 s, which is of course, a shorter response time than the 1 s of the filter 31. This calculation in module 34 may be simplified in the manner noted above for the period low pass filter by storing $S_i = \overline{E}_i \times 16$ between iterations.

The scaler 35 may complement the phase error filter 34. It may reduce the magnitude of the output of the phase error filter 34 by a factor 1/X before it is applied to the phase adjuster, the output of which is therefore given by $$\overline{P}'_i = \overline{P}_i - \frac{\overline{E}_i}{X}.$$

The output of the phase error filter 34 is of the same magnitude as the error between the timing of the zero-crossings predicted by the local oscillator and the actual ones, but that output cannot change substantially over less than 1/4 s, or 16 periods. Now, if output $\overline{E}_i$ were to be applied directly to phase adjuster 32, it would make the full correcting adjustment 16 times, i.e. it might substantially overshoot and the phase of the local oscillator may tend to oscillate considerably about the target value. To avoid this, the scaler 35 may reduce the correction made at zero-crossing. In one example, the value used for the scaler is X=16, so that the error in phase is reduced over about 16 cycles—assuming the error does not change in the meantime. A smaller value for X may well result in oscillation.

A larger value for X may limit the speed with which the local oscillator can track phase changes usurping this design parameter from the filter 34. Indeed, in some cases, the scaler 35 could be provided as the low pass filter per se, i.e. without the filter 34, since by itself it acts as a low-pass filter.

Since the scaler may only change the magnitude of a value, it need not be an explicit component or calculation step by itself, and its effect may be absorbed into other components or calculations, for example the filter 34 or the phase adjuster 32, if desired.

A resynchroniser 36 may also be provided. The resynchroniser 36 may receive the phase error values from the phase comparator 33. It may then check to see whether each of those values has exceeded predetermined limit values. If so, it may trigger the local oscillator 29 to perform a resynchronisation in which the local oscillator predicts the next zero-crossing as the time of the last one plus the present average period.

Figure 5:
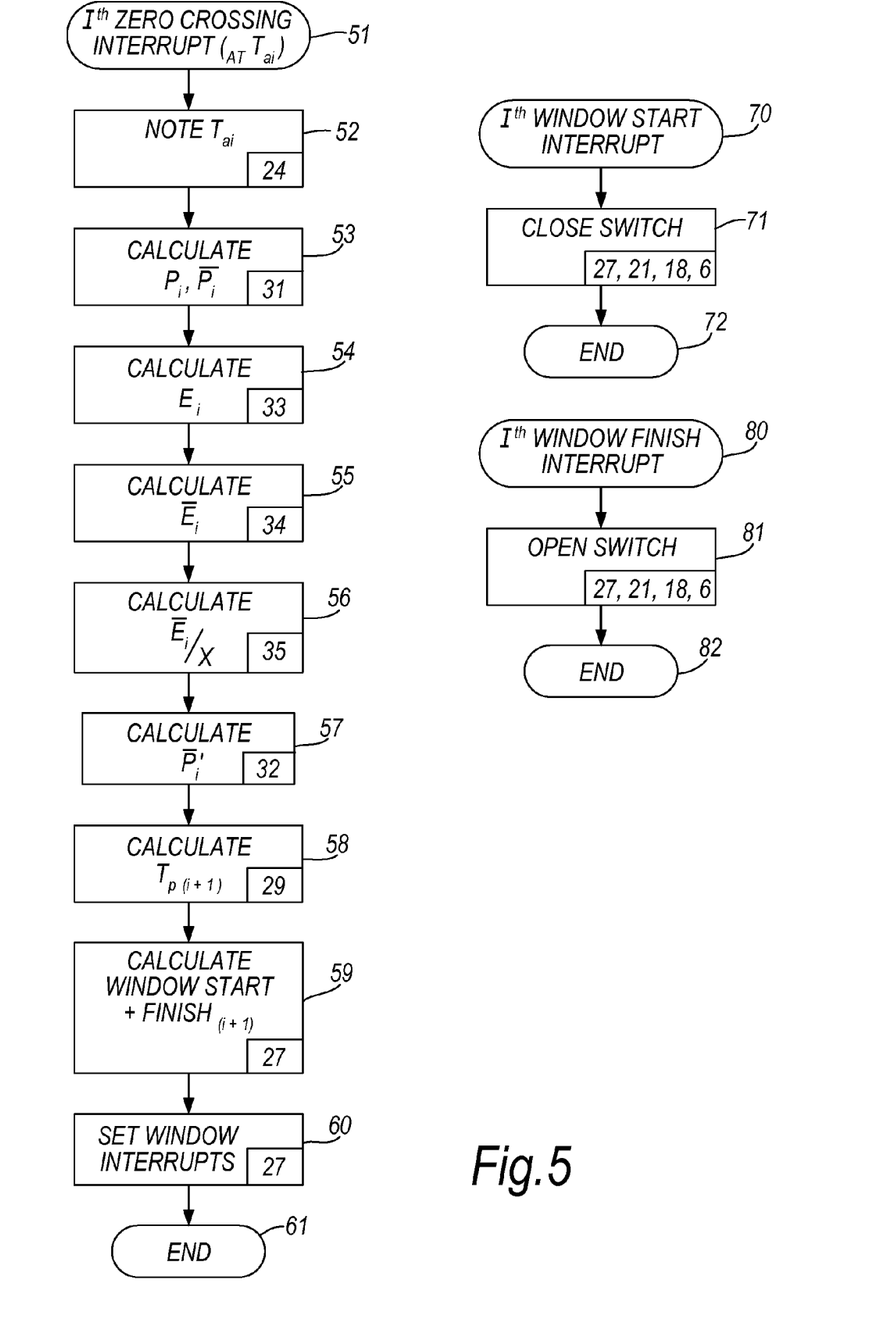
FIG. 5 is a flow chart showing illustrative operation of the controller of the illustrative dimmer of FIG. 1.
Figure 6:
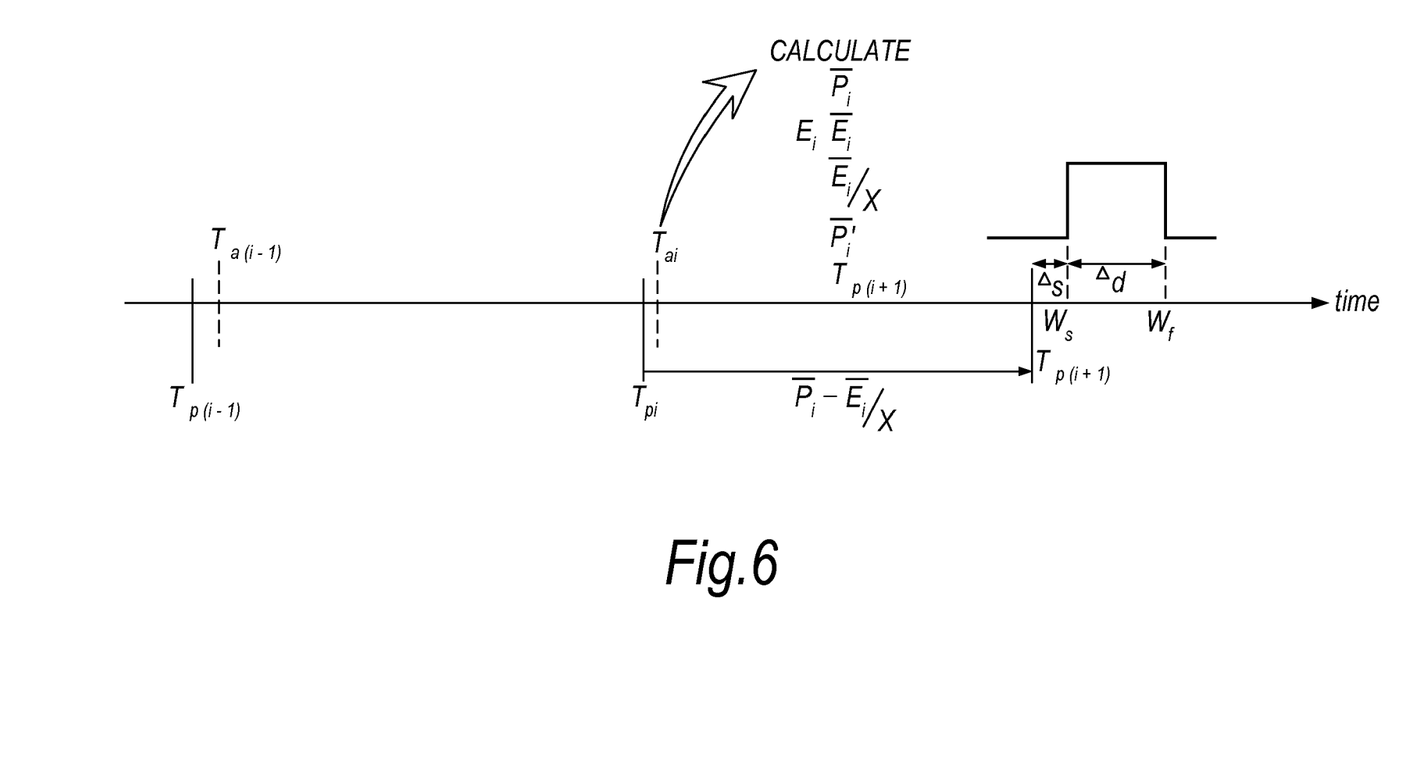
FIG. 6 is a timeline showing illustrative events in the operation of the exemplary dimmer of FIG. 1.

The software modules of the controller 17 are in general triggered to update the values they produce each time it receives a detection signal from the ZCD 16. Thus, in one example, when the $i^{th}$ actual zero-crossing is detected, the following calculation steps may be performed, which are illustrated in FIG. 5. The boxes of FIG. 5, showing the illustrative process steps, are also labelled in the bottom right corner of each box with the reference numeral of the modules in FIGS. 2 and 3 which may perform those steps. FIG. 6 is a timing diagram of the events.

In step 51 the $i^{th}$ zero-crossing is detected, and causes several calculation steps to be performed. In a microprocessor implementation, the zero-crossing detector 16 may be connected to provide an interrupt to the processor 17 at this time and the processor 17 may perform the calculations in the interrupt handling routine.

First (step 52), the time of the interrupt is obtained from the clock 26 and it is recorded as $T_{ai}$. Next (step 53), the values $P_i$, $\overline{P}_i$ are calculated in the manner described above. Next (steps 54, 55 and 56), the values $E_i, \overline{E}_i$, $$\frac{\overline{E}_i}{X}$$

are calculated as described above. These are then (step 57) used to adjust the value of the average period $\overline{P}_i$ to $\overline{P}_i'$ in the manner described above, which (step 58) is then used to predict the time of the next zero crossing $T_{p(i+1)}$. The start and finish times of the next "on" window to be aligned with $T_{p(i+1)}$ are then calculated from it (step 59) to provide a power set by the control knob 9. Those start and finish times are then used to program a timer (also shown at 26, FIG. 3) to generate interrupts at those times.

FIG. 6 shows the start and finish times for the window relative to $T_{p(i+1)}$. The start time is shown at an interval $\Delta_s$ after the predicted zero-crossing but preferably is timed to be at the predicted zero-crossing ($\Delta_s=0$). The finish time is set at a period $\Delta_d$ after that. In one example, the switch is closed at the predicted time of the positive going zero-crossing and the zero-crossing detector is configured to detect zero-crossings when the switch is open. Thus, in some cases, the zero-crossing detector may be arranged to detect the voltage waveform going through a voltage threshold that is below zero, which occurs before the positive going zero crossing, which is while the switch is still open.

In the simplest form of setting the power, only $\Delta_d$ is varied in response to the power required but, as noted above, more complex schemes where both $\Delta_d$ and $\Delta_s$ are varied are possible. In principle, the window could start before the predicted zero-crossing and even span the zero-crossing but those are not preferred at present.

The interrupts 70, 80 (FIG. 5) are eventually handled by the switch window generator 27, which generates 71, 81 signals at those time to close and open the switch 6 respectively.

Note that the timers for the window set relative to the $i^{th}$ predicted zero-crossing $T_{pi}$ may already be set before the $i^{th}$ actual zero crossing $T_{ai}$ occurs, and since the actual time of that is not known, the actual zero-crossing may occur before or after $T_{pi}$ and during or outside the window. Note, the $(i+1)^{th}$ window is shown in FIG. 6, but the $i^{th}$ window is omitted for clarity of illustration.

The invention claimed is:

1. A switch circuit comprising
first and second terminals,
a switch connected between the first and second terminals, and
a control circuit connected to the switch to operate the switch to selectively connect and disconnect the first and second terminals,
the control circuit comprising:
a defined point detector connected to the first and second terminals to provide indications of times of occurrences of a defined point on the waveform between the first and second terminals;
a period low-pass filter connected to receive the indications of the defined point times and to provide a low-pass filtered signal of the periods between the times indicated;
a local oscillator connected to receive the low-pass filtered periods and to provide indications of predicted defined point times based on the previous predicted defined point time and the current value of the low pass-filtered period;
a phase comparator connected to receive the indications of the defined point times and the respective indications of predicted defined point times and to provide error indications of a difference between respective pairs of defined point times and predicted defined point times;
an error low-pass filter connected to receive the error indications and to provide a low-pass filtered output of the error indications;
a phase adjuster connected to receive the low-pass filtered error indications and to apply the low-pass filtered error indications to the low-pass filtered periods before those periods are applied to the local oscillator; and
an output section connected to receive the predicted defined point times and responsive thereto to operate the switch to selectively connect and disconnect the first and second terminals.

2. A switch circuit as claimed in claim 1 comprising a scaler connected to receive the low-pass filtered error indications and to scale those down by a constant factor.

3. A switch circuit as claimed in claim 1 wherein the error low pass filter is provided in the form of a scaler.

4. A switch circuit as claimed in claim 1 wherein the error low pass filter has a shorter response time than the period low pass filter.

5. A switch circuit as claimed in claim 1 wherein the defined point detector is connected to detect the potential difference between the first and second terminals passing through a reference level.

6. A switch circuit as claimed in claim 5 wherein the reference level is zero.

7. A switch circuit as claimed in claim 5 wherein the reference level is non-zero.

8. A switch as claimed in claim 1 wherein the output section comprises a window generator responsive to the predicted defined point times to generate switch on and switch off times.

9. A switch generator as claimed in claim 8 wherein the output section is further responsive to a power level indication in the generation of the switch on and switch off times.

10. A method of controlling a switch comprising
measuring to obtain indications of the times of occurrences of a defined point within the waveform of a supply connected across the switch,
low-pass filtering the durations of the periods between the indicated defined point times,
applying the low-pass filtered periods to a local oscillator to control the period thereof, the local oscillator providing predictions of the times of the next occurrence of the defined point,
detecting the error between the times of respective measured and predicted occurrences of the defined point,
low-pass filtering the errors and adjusting the low-pass filtered periods applied to the local oscillator with the resultant in the sense that tends to reduce the error,
and operating the switch at times dependent on the predicted times of the occurrences of the defined point.

11. A method as claimed in claim 10 wherein the defined point is a zero-crossing in the waveform.

12. A dimmer switch comprising
first and second mains terminals,
a switch connected between the first and second terminals, and
a control circuit connected to the switch to operate the switch to selectively connect and disconnect the first and second terminals,
the control circuit comprising:
a defined point detector connected to the first and second terminals to provide indications of times of occurrences of a defined point on the waveform between the first and second terminals;
a period low-pass filter connected to receive the indications of the defined point times and to provide a low-pass filtered signal of the periods between the times indicated;
a local oscillator connected to receive the low-pass filtered periods and to provide indications of predicted defined point times based on the previous predicted defined point time and the current value of the low pass-filtered period;
a phase comparator connected to receive the indications of the defined point times and the respective indications of predicted defined point times and to provide error indications of the difference between respective pairs of defined point times and predicted defined point times;
an error low-pass filter connected to receive the error indications and to provide a low-pass filtered output of the error indications;
a phase adjuster connected to receive the low-pass filtered error indications and to apply the low-pass filtered error indications to the low-pass filtered periods before those periods are applied to the local oscillator; and
an output section connected to receive the predicted defined point times and responsive thereto to operate the switch to selectively connect and disconnect the first and second terminals.

* * * * *